United States Patent [19]
Kynett et al.

[11] Patent Number: 5,249,158
[45] Date of Patent: Sep. 28, 1993

[54] FLASH MEMORY BLOCKING ARCHITECTURE

[75] Inventors: Virgil N. Kynett, El Dorado Hills; Mickey L. Fandrich, Placerville; Steven E. Wells, Citrus Heights; Kurt B. Robinson, Newcastle; Owen W. Jungroth, Sonora, all of Calif.

[73] Assignee: Intel Corporation, Santa Clara, Calif.

[21] Appl. No.: 654,263

[22] Filed: Feb. 11, 1991

[51] Int. Cl.5 .............................................. G11C 11/34
[52] U.S. Cl. ............................. 365/230.03; 365/185; 365/230.06; 365/218
[58] Field of Search ............. 365/230.03, 185, 230.06, 365/218

[56] References Cited
U.S. PATENT DOCUMENTS

| | | | |
|---|---|---|---|
| 4,783,766 | 11/1988 | Samachisa et al. | 365/185 |
| 4,982,372 | 1/1991 | Matsuo | 365/230.03 |
| 5,003,510 | 3/1991 | Kamisaki | 365/230.03 |
| 5,065,364 | 11/1991 | Atwood et al. | 365/230.03 |
| 5,083,294 | 1/1992 | Okajima | 365/230.03 |
| 5,097,450 | 3/1992 | Toda et al. | 365/230.03 |
| 5,109,361 | 4/1992 | Yim et al. | 365/230.03 |
| 5,126,808 | 6/1992 | Montalvo et al. | 365/189.01 |
| 5,148,401 | 9/1992 | Sekino et al. | 365/230.03 |

*Primary Examiner*—William L. Sikes
*Assistant Examiner*—Scott A. Ouellette
*Attorney, Agent, or Firm*—Blakely, Sokoloff, Taylor & Zafman

[57] ABSTRACT

A blocking architecture for use in non-volatile semiconductor memories is disclosed. This architecture minimizes device area taken up by signal lines while maximizing device yield. Additionally, this architecture minimizes the Y decoding mechanism while maximizing device performance.

15 Claims, 5 Drawing Sheets

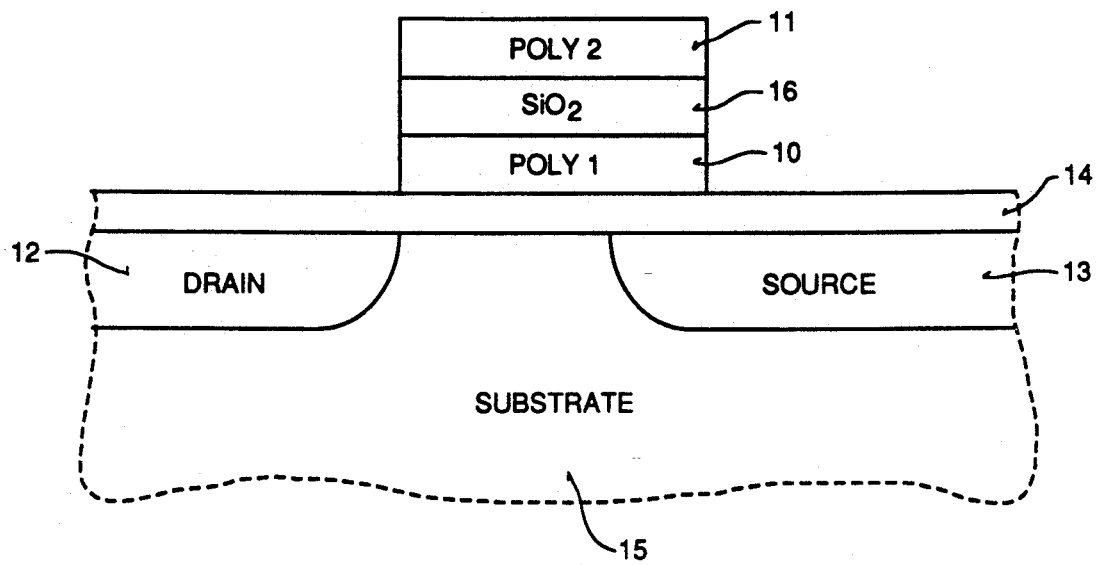
FIG_1 (PRIOR ART)
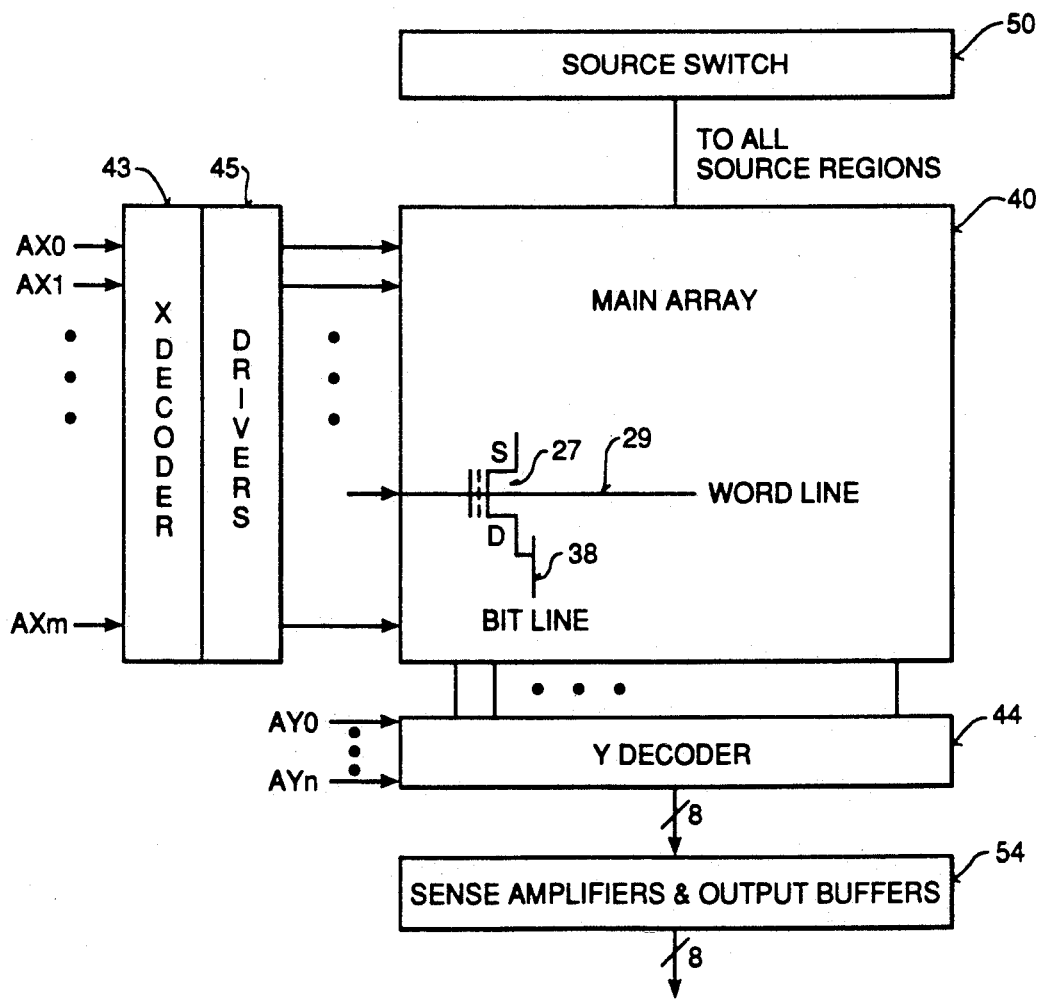
FIG_2 (PRIOR ART)

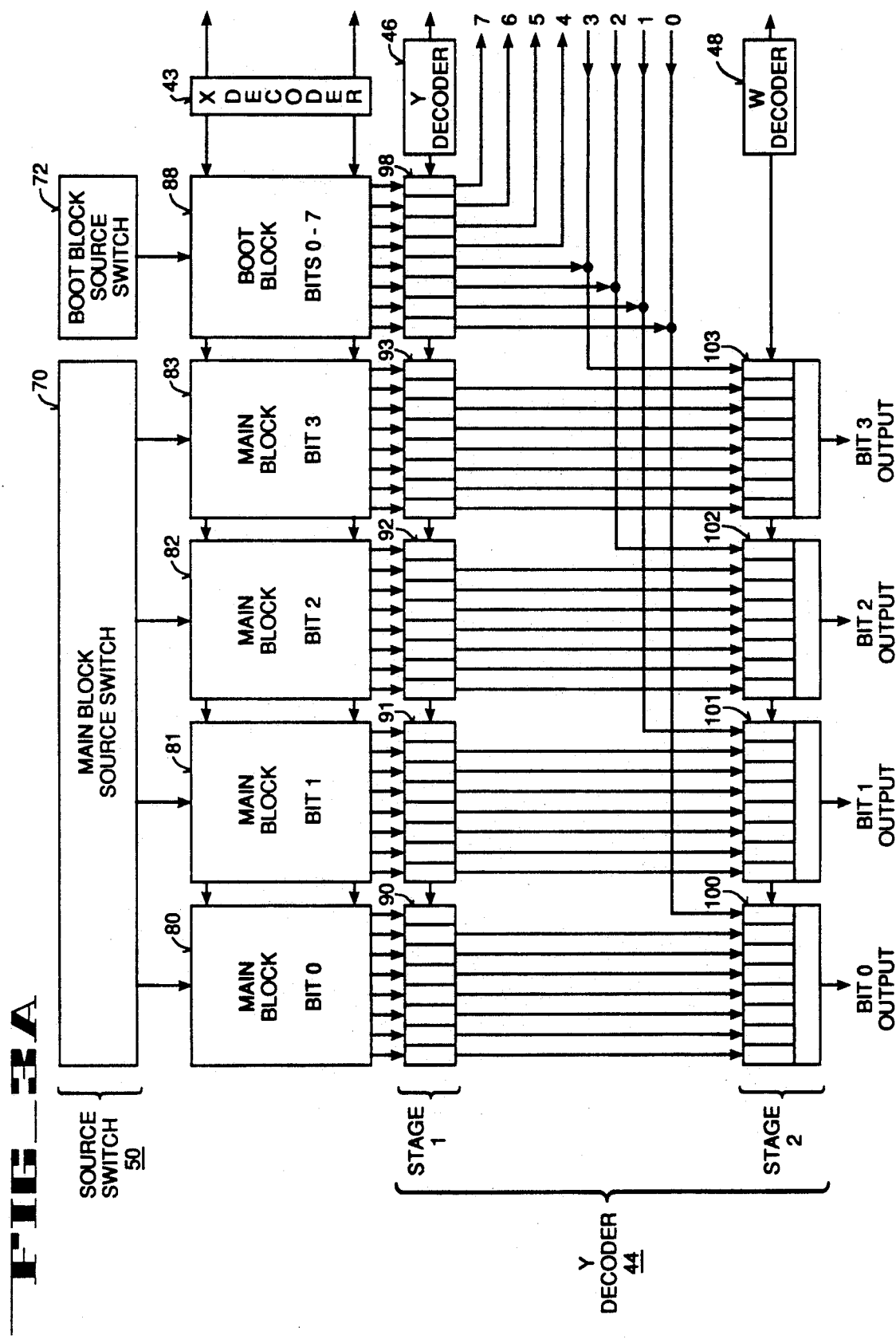

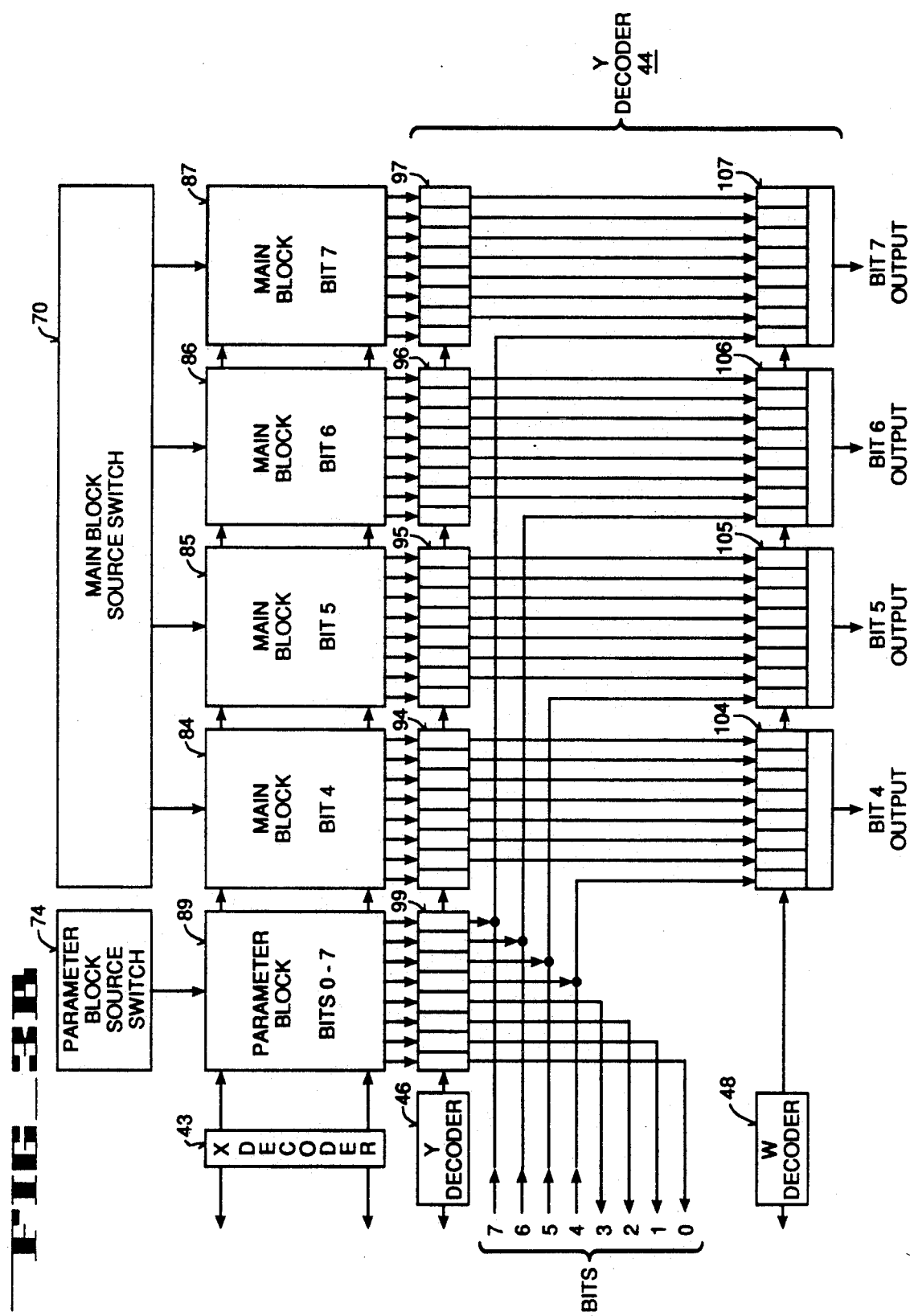
FIG_3B

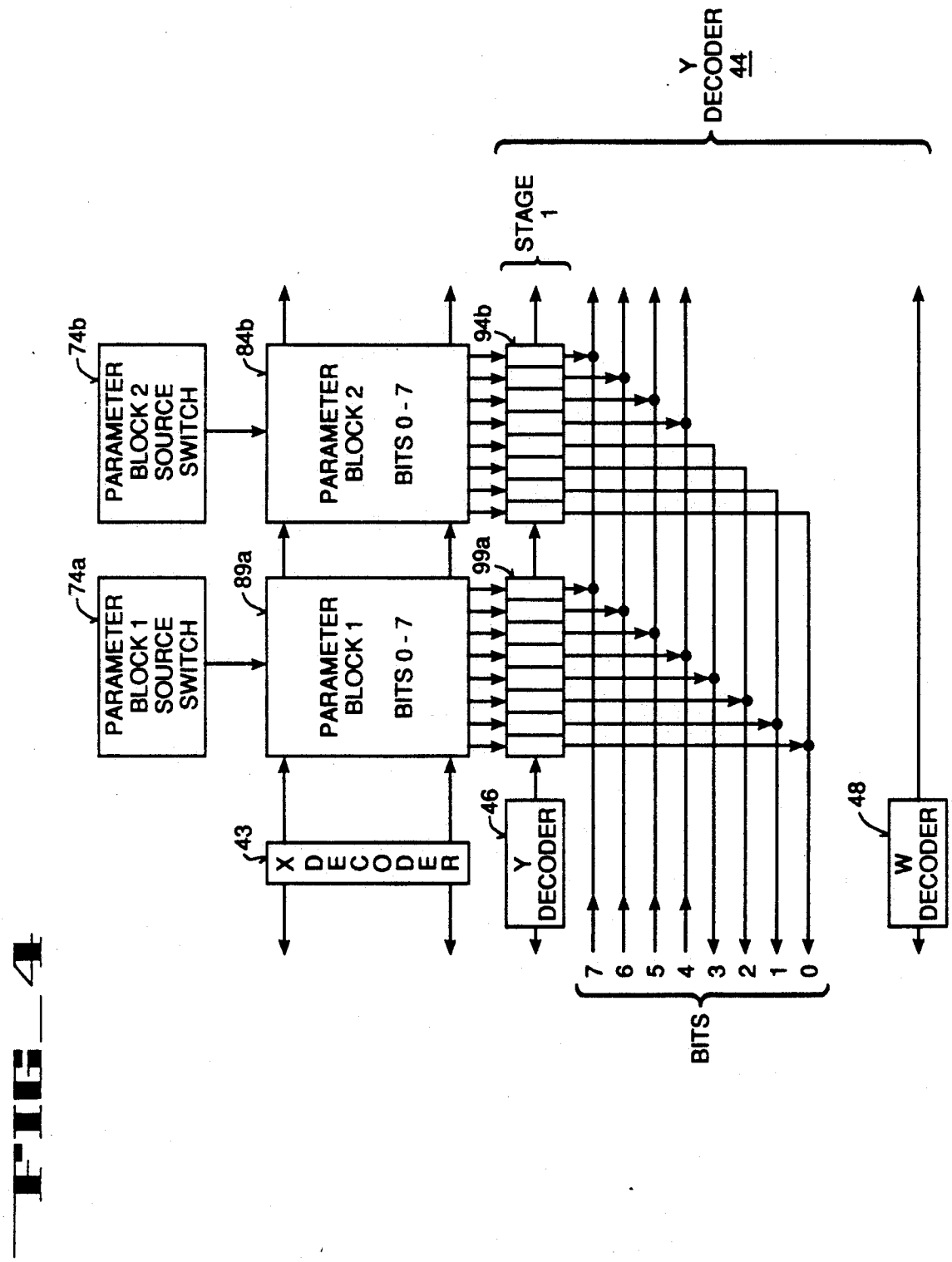

FLASH MEMORY BLOCKING ARCHITECTURE

FIELD OF THE INVENTION

The present invention relates to the field of non-volatile semiconductor memories. More specifically, the present invention relates to the field of electrically programmable read-only memories, particularly those employing floating gate memory devices.

BACKGROUND OF THE INVENTION

Metal-Oxide-Semiconductor (MOS) electrically programmable read-only memories (EPROMS) frequently use memory cells that have electrially isolated gates (floating gates). These floating gates are typically completely surrounded by insulation and formed from a polycrystalline silicon (polysilicon) layer. Information is stored in the memory cells or devices in the form of charge on the floating gates. Charge is transported to the floating gates by a variety of mechanisms such as avalanche injection, channel injection, tunnelling, etc., depending on the construction of the cells. The cells are erased generally by exposing the array to ultraviolet radiation. An example of these cells can be found in U.S. Pat. Nos. 3,500,142; 3,660,819; 3,755,721; and 4,099,196. In some cases these cells are electrically erasable (EEPROM cells). An example of such a cell is shown in U.S. Pat. No. 4,203,158.

The invention of the present application is used with an EPROM cell, particularly one which is electrically erasable, commonly referred to as a "flash" EPROM cell.

Due to the nature and design of a typical flash memory device, the entire device must be erased in order to erase any one cell in that device. This exposes all of the data in the memory device to potential data loss or corruption due to the erasure and reprogramming process whenever a portion of the data needs to be erased and reprogrammed.

Flash memory array blocking allows segregating different portions or types of data. In this way, when one portion needs to be erased, the other portion(s) do not have to be erased and are therefore not exposed to potential data loss or corruption. Thus, flash memory array blocking provides an increased level of data integrity previously achieved through the use of multiple chips each containing a different portion or type of data.

SUMMARY AND OBJECTS OF THE INVENTION

One object of the present invention is to provide a blocked memory with optimized block sizes.

Another object of the present invention is to provide a blocked memory with a minimum of signal lines and output selector logic.

Another object of the present invention is to provide a blocked memory with redundant columns.

Another object of the present invention is to provide a blocked memory with different blocks for different purposes.

Another object of the present invention is to provide a blocked memory which can be booted from either end of the logical address space.

These and other objects of the present invention are provided for by a memory device having a plurality of electrically programmable and electrically erasable memory cells each having a source region, drain region and control gate. The memory device has two memory arrays, each divided into multiple blocks having a plurality of generally parallel bit lines coupled to the drain regions of the memory cells within the block. Each of the two memory arrays comprise five blocks where four of the five blocks comprise 112 bit lines each and the remaining one of the five blocks comprises 64 bit lines. The memory device further has word lines, generally perpendicular to the bit lines, which are coupled to the control gates of one cell in each bit line. The memory device further has row decoder means for decoding row addresses and for selecting word lines such that when one of the word lines is selected the potential on the control gates along the word line in all of the blocks is changed. The memory device further includes column decoder means for decoding column addresses and for selecting bit lines such that when any of the bit lines are selected the potential on the drain regions connected to the bit lines is changed. The memory device further has source switching means for connecting the source regions of the cells in each block such that the potential on the source regions in a selected block is changed.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which:

FIG. 1 is a cross-section elevational view of a prior art non-volatile floating gate memory device or cell used in the currently preferred embodiment of the present invention;

FIG. 2 is a block diagram of a layout of a prior art memory device;

FIG. 3a and 3b are block diagrams of a block layout of memory arrays of a memory device of the present invention;

FIG. 4 is a block diagram of a block layout of multiple parameter blocks of memory arrays of a memory device as used in the currently preferred embodiment of the present invention;

DETAILED DESCRIPTION

Figure 5:
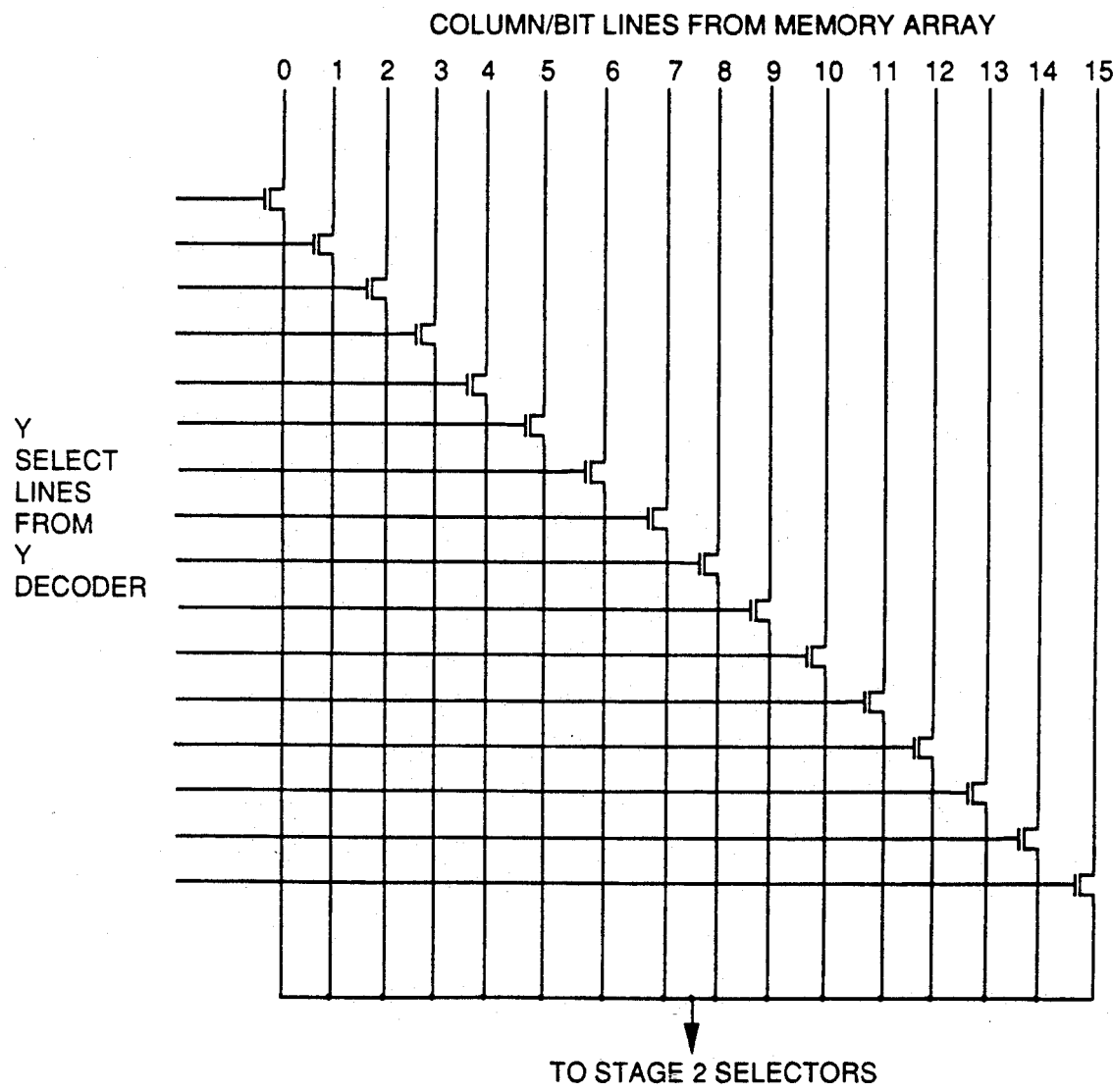
FIG. 5 is a circuit diagram of a 1:16 selector as used in the currently preferred embodiment of the present invention.

A blocking architecture for use in non-volatile semiconductor memories is disclosed. In the following description, numerous specific details are set forth, such as specific materials, devices, process steps, dimensions, sequences, etc., in order to provide a thorough understanding of the present invention. It will be obvious, however, to one skilled in the art that these specific details need not be employed to practice the present invention. In other instances, well-known processing steps and device configurations are not described in detail in order not to unnecessarily obscure the present invention.

Referring now to FIG. 1, the memory device or cell used with the presently preferred embodiment is formed on a silicon substrate such as the p-type substrate 15 of FIG. 1. Please note that the device of FIG. 1 is shown in a partially fabricated state since this best reveals its structure. The device includes a pair of spaced-apart doped regions disposed in the substrate, specifically a drain region 12 and a source region 13. A polysilicon floating gate 10 is generally disposed above and between these regions and insulated from these regions by a layer of silicon dioxide or other insulative layer 14. The floating gate 10, at the completion of the processing, is completely surrounded by insulative layers and, hence, electrically floats. A second gate (control gate 11) is disposed above the floating gate 10; in the presently preferred embodiment this gate is fabricated from a second layer of polysilicon. This control gate is a continuous polysilicon strip forming a word line of the memory array of FIG. 2.

It will be appreciated that the cell of FIG. 1 may be fabricated using well-known NMOS or CMOS technology. The n-channel device illustrated in FIG. 1 may be fabricated directly in a p-type substrate or, when an n-type substrate is used, may be fabricated in a p-type well formed in the substrate. Other variations, such as employing both p-wells and n-wells, are well known in the art.

As currently employed, the memory devices are programmed (i.e., negatively charging the floating gate) by coupling the word line or control gate 11 to a potential of approximately +12 volts, the drain region to a potential of approximately +7 volts, and the source region to ground. With these conditions, channel hot electron injection occurs through the oxide layer 14 which layer, in the currently preferred embodiment, is approximately 115 Å thick.

To erase the cell, the drain region is floated, the word line or control gate 11 is grounded, and a potential of approximately +12 volts is applied to the source region. Under these conditions charge is tunnelled from the floating gate.

During reading of the cell, a positive potential less than that which would cause charge to transfer onto the floating gate is applied to the control gate (e.g., 5 volts) and a potential (e.g., 1 volt) is applied to the drain region. Current through the device is sensed to determine if the floating gate is or is not negatively charged. As with other floating gate devices, the negative charge on the floating gate shifts the threshold voltage of the device making it less conductive. Thus, with a sense amplifier, the presence or absence of charge on the floating gate can be determined. This defines whether a cell is programmed with a binary one or zero.

Referring now to FIG. 2, the memory cells of a flash memory array are formed at intersections of word lines and bit lines, as is the common practice. The drain terminals of the memory cells are coupled to the bit lines. The control gates are formed from continuous strips of polysilicon which extend across the entire array to form the word lines. The generally parallel bit lines are perpendicular to the generally parallel word lines. For example, in memory array 40, cell 27 has its drain region coupled to bit line 38 and its source region coupled to source switch 50. The word line 29 extends to a plurality of other cells along the word line. The source regions for all the cells in memory array 40 are connected to a common node allowing this node to be switched to different potentials by source switch 50.

The X decoder 43 selects a single word line in memory array 40 for each of the addresses $A_{X0}$-$A_{Xm}$ applied to it. The Y decoders select one byte (8 bit lines) from memory array 40 for each of the Y addresses $A_{Y0}$-$A_{Yn}$ and couples 8 bit lines from memory array 40 to the sense amplifier and output buffer 54. Source switch 50 is controlled by Y decoder 44 and causes the source regions of the cells in the memory array to be coupled to the different potentials for reading, programming, and erasing.

With a flash memory array that is not blocked, the entire array must be erased whenever it is desired to erase any portion of the array. This exposes the other portions of memory to potential data loss or corruption due to the erasure and reprogramming process.

Flash memory array blocking allows segregating different portions or types of data. In this way, when one portion needs to be erased, the other portion(s) do not have to be erased and are therefore not exposed to potential data loss or corruption. Thus, flash memory array blocking provides an increased level of data integrity previously achieved through the use of multiple chips each containing a different portion or type of data.

Referring now to FIGS. 3a and 3b the memory array has been subdivided into multiple logical blocks in the preferred embodiment of the present invention. In the preferred embodiment, each block or group of blocks of the subdivided memory array is intended to be used for a different function. The three functions intended to be supported by the present invention are a boot area, a parameter area, and a main area or application space. The boot area holds the code needed to boot a processor connected to the flash memory device. The parameter area holds parameter information as needed by whatever application the flash memory device is supporting. The main area or application space contains the application code itself.

In the preferred embodiment of the present invention, the flash memory is a 1 megabit (Mb) device comprised of 1024 rows by 1024 columns. The three functions or types of blocks each take up a portion of the total 1 Mb (equal to 1024 Kb or 128 KB) of memory space available. In the preferred embodiment, the boot area is 8 KB, the parameter area is 8 KB (or two 4 KB areas, as discussed more fully below), and the main area is 112 KB. These sizes are achieved through grouping of column lines and careful arrangement of Y decoding mechanisms as will be discussed more fully below. Please note that other block sizes would be equally supportable by the present invention by merely varying the number of row word lines.

Merely sequentially dividing the 1024 columns into the first 64 columns, the next 64 columns, and the remaining 896 columns is not an optimal configuration due to the propagation delay which exists in all signal lines. Signal line propagation delay particularly affects the word lines of each row because word lines must travel across all the blocks of the entire memory array. Thus, if the 1024 column array were to be sequentially divided into 64, 64, and 896 columns, the word line signal as generated by the X decoder would have to travel across the entire memory array when addressing the main application area. Thus, the main application area would incur the greatest propagation delay with this configuration. And merely swapping the sequential order to place the main application area first, the parameter area second, and the boot area last, would only move the word line signal propagation delay to the parameter area and to the boot area. Further, due to the much larger size of the main application area there would still be some propagation delay in the addresses which access the later columns in the main application area.

One configuration to cut down on the signal line propagation delay is to subdivide the memory array into two smaller arrays and then place the X decoder in between the two smaller arrays. In this way, the word line signal from the X decoder would only have to travel half the distance of a single larger array which thus results in a 75% reduction in propagation delay due to the fact that propagation delay is a function of the distance squared. Once it has been determined that placing the X decoder in between two smaller memory arrays can help address signal line propagation delay considerations, allocation of columns for the different logical blocks must again be made.

In the preferred embodiment of the present invention the two equally sized memory arrays are each comprised of 1024 rows by 512 columns (512 Kb or 64 KB) with the X decoder placed in between them. Because the main application area of 112 KB is larger than the 64 KB available in each of the smaller arrays the main application area is spread across both of the smaller 64 KB arrays in the preferred embodiment of the present invention. Additionally, as is explained more fully below, the 112 KB main application area is not only spread across both memory arrays but is equally divided between them. The 8 KB boot area is then placed in one of the two smaller arrays while the 8 KB parameter area is placed in the other of the two smaller arrays.

Of course, the 8 KB parameter block could be further subdivided so as to support multiple parameter areas. For example, in the preferred embodiment of the present invention, the 8 KB parameter block is subdivided into two 4 KB parameter blocks. Having two parameter blocks provides an additional level of data integrity. Whenever the user desires to update the parameter information, the information in the parameter block currently being used can be copied to the other parameter block and then the updated parameter information can be written to the first parameter block. This way, if something goes wrong when the updated parameter information is being written to the first parameter block (e.g., a power failure occurs) the current parameter information is not lost. This is because it is still available in the other parameter block and can be copied back to the first parameter block. Please note that throughout the remainder of the detailed description whenever parameter block 89, parameter block source switch 74, or stage one selector 99 of FIG. 3b is referenced, the preferred embodiment of parameter blocks 89a and 89b, parameter block source switches 74a and 74b, and stage one selectors 99a and 99b of FIG. 4 are equally applicable.

Another consideration is subdividing the single large memory array into multiple blocks based on column grouping (regardless of whether the single large array is split up into two smaller arrays) is the complexity of the Y decoding scheme. This complexity is based on the size of the Y decoder itself, the number and complexity of the bit line selectors and the number of signal lines between the Y decoder and the bit line selectors. This complexity affects device performance, again due to signal propagation delay, as well as the device size taken up by the signal lines themselves.

In the preferred embodiment of the present invention, no signal line from the memory array travels more than half the distance across the entire memory array which thus minimizes propagation delay. Further, only the boot area and the parameter area require signal lines to travel laterally across the memory array between successive selector stages which thus further minimizes both propagation delay and chip space taken up by these lines. Additionally, in the preferred embodiment of the present invention, signal lines between successive selectors for the boot area, the parameter area, and the main application area are kept to a maximum of 8 per block to minimize the amount of chip space (also known as die area) taken up by these signal lines.

Referring again to FIGS. 3a and 3b, boot block 88 is part of the memory array located to the left of X decoder 43 and parameter block 89 is part of the memory array located to the right of X decoder 43. In this way, the first 64 columns of the memory array located left of X decoder 43 are allocated to boot block 88 and the first 64 columns of the memory array located right of X decoder 43 are allocated to parameter block 89.

The 64 bit lines of the 64 columns of boot block 88 are fed into selectors 98 (known as stage one) which are comprised of eight 1:8 selectors each coupled to receive eight of the total of 64 bit lines. Selectors 98 are controlled by Y decoder 46 which decodes the first stage of the Y portion (columns/bit lines) based on the address input to it. The circuitry of selectors 98 is explained more fully below.

The main application area is equally divided across the remaining 448 (512−64) columns in each of the two separate memory arrays. Thus, the main application area is divided into two groups of 448 columns each which is then further broken down into eight equally sized blocks of 112 columns each. Four of the eight 112 column main application area blocks (reference nos. 80-83) are thus located in the array on the left side of X decoder 43 and four of the eight 112 column main application area blocks (reference nos. 84-87) are thus located in the array on the right side of X decoder 43. Each 112 column block (numbered 80-87 in FIGS. 3a and 3b) supports one of the eight bits of the 112 KB main application area.

The 112 columns of bit lines of each main block are connected to seven 1:16 selectors. For example, in block 80 (which provides byte 0 of the main application area) each successive 16 bit lines of the 112 columns are fed into one of eight 1:16 selectors (reference no. 90). Although there are a total of eight selectors which make up selector 90, only seven are needed to support 112 columns ($112 \div 16 = 7$). The additional selector in each of the stage one selectors 90-97 connected to each main block 90-97 respectively is used to support column redundancy as is discussed more fully below.

Referring now to FIG. 5, an example 1:16 selector as used in selectors 90-97, can be seen. The 1:16 selector receives 16 Y select lines from Y decoder 46 which determines which one of the 16 input bit line signals will be output from that 1:16 selector. Because only one select line input to the 1:16 selector from Y decoder 46 will be high at a time, only the transistor which is connected to it will be turned on, thus allowing only that one bit line signal to be passed on. The remaining bit line signals, connected to transistors which do not receive a high selector signal at their gates, will conversely not be transmitted.

Referring again to FIGS. 3a and 3b, the single bit line signal output from each of the seven (eight with column redundancy) 1:16 selectors of stage one (reference nos. 90-99) is transmitted to a second stage of selectors (reference nos. 100-107). Selectors 100-107 each comprise a 1:8 selector which receives 8 input signals from the stage one selectors 90-99 and outputs a one bit signal based on the output of the W decoder 48.

with the preferred embodiment of the present invention.

| Address | W Decode Inputs | | | Y Decode Inputs | | | | |
|---|---|---|---|---|---|---|---|---|
| | A16 | A15 | A14 | A13 | A12 | A11 | A10 | |
| 1FFFF | 1 | 1 | 1 | 1 | 1 | x | x | |
| . | . | . | . | . | . | . | . | (Boot Block - W7, Y8-15) |
| 1E000 | 1 | 1 | 1 | 1 | 0 | x | x | |
| 10FFF-10000 | 1 | 1 | 1 | 0 | 1 | x | x | (PARM 2 - W7, Y4-7) |
| 1CFFF-1C000 | 1 | 1 | 1 | 0 | 0 | x | x | (PARM 1 - W7, Y0-3) |
| 1BFFF- | 1 | 1 | 0 | x | x | x | x | |
| | 1 | 0 | 1 | x | x | x | x | |
| | 1 | 0 | 0 | x | x | x | x | (MAIN Block - W0-6, Y0-15) |
| | 0 | 1 | 1 | x | x | x | x | |
| | 0 | 1 | 0 | x | x | x | x | |
| | 0 | 0 | 1 | x | x | x | x | |
| 00000 | 0 | 0 | 0 | x | x | x | x | |

It is the combination of Y decoder 46, W decoder 48 and selector stage one which allows the 1:8 selectors of stage 2 to support all of the columns of all the different blocks. It is Y decoder 46 in combination with the 1:16 selectors 90-97 of selector stage one that reduces the 112 possible column/bit lines of each main block down to seven, or, in combination with the 1:8 selectors 98 and 99 of selector stage one that reduces the 64 possible column/bit lines of either the boot block 88 or the parameter block 89 down to eight. Thus, if the address is within the range of boot block 88, the only output from stage one selectors 90-99 will be from selector group 98 which is coupled to receive the output from boot block 88. Therefore, second stage selectors 100-107 will only be receiving input signals from stage one selector 98 and as such there is no contention for access to selectors 100-107 between the different blocks.

Y decoder 46 is a 1:16 decoder which decodes addresses $A_{10-13}$ and signals the stage one selectors 90-99. W decoder 48 is a 1:8 decoder which decodes addresses $A_{14-16}$ and signals the stage two selectors 100-107. Further, as can be seen by reviewing the table below, addresses $A_{12-16}$ indicate which block is being selected. For example, if the input address to W decoder 48 ($A_{14-16}$) is less than seven (111), then W decoder 48 selects the main block. And if the main block is selected, the input address to Y decoder 46 ($A_{12-16}$) will determine which line of each of the 16 selectors of stage one coupled to each main block will be selected.

Similarly, if the input address to W decoder 48 ($A_{14-16}$) is a seven (111), then W decoder 48 does not select the main block in which case either the boot block or the parameter block may be selected. It is Y decoder 46 which makes this determination. For example, if the input address to Y decoder 46 ($A_{12-16}$) is greater than seven then the boot block is selected but if it is equal to or less than seven then the parameter block is selected. Of course, with two parameter blocks, one parameter block may be selected when the input address to Y decoder 46 ($A_{12-16}$) is seven and the other parameter block may be selected when the input address to Y decoder 46 ($A_{12-16}$) is less than seven. Then, similarly to when the main block was selected, when either the boot block or the parameter blocks are selected, the input address to Y decoder 46 will determine which line of each of the eight selectors of stage one coupled to the boot block or parameter blocks will be selected. Please note that the addressing in the table below further indicates support for two parameter blocks in accordance Additionally, the addressing scheme as illustrated by the table above supports placement of the boot block at the top end of the address space. As such, the processor supported by the flash memory device of the present invention is bootable from the address space of 1E000 to 1FFFF. Stated differently, although the boot block is physically located towards the middle of the device (adjacent to the X decoder), the logical address space can be defined anywhere in the physical memory array and therefore the boot block can be logically located at the top end of the addressing range. To repeat, although the boot block is physically located towards the middle of the device, it may be logically located at an address of 1E000-1FFFF.

However, some processor manufacturers specify booting from one end of the addressing range (e.g., 00000) while other processor manufacturers specify booting from the other end of the addressing range (e.g., 1FFFF). It is therefore advantageous to be able to boot from either end of the addressing range to thus support these different processor manufacturer's requirements.

The preferred embodiment of the present invention supports placement of the boot block at either end of the address space as well as moving the other blocks within the address space. This is achieved through flipping the five high order Y and W decoder address bits ($A_{12}-A_{16}$, which, as stated above, indicate which block is being selected) via a switchable address space bit. By comparing each of the five high order address bits with a switchable address space bit in an Exclusive OR (XOR) gate, whenever the switchable address space bit is switched so are the five address bits. Therefore, by merely switching the switchable address space bit, the boot block can be addressed at the bottom end of the address space (i.e., beginning with an address of 00000) instead of the top of the address space (i.e., beginning with an address of 1E000). Therefore, the memory device of the preferred embodiment of the present invention supports booting from either end of the addressing range to thus support different processor manufacturer's requirements. Of course, by using additional input logic circuitry, the boot block could be placed elsewhere in the address space as could the other blocks defined by this architecture.

As was stated above, in the preferred embodiment of the present invention stage one selectors 90-97 (which support main blocks 80-87) each have an additional selector to support column redundancy. Column redundancy provides for setting of an alternate column should a bit line prove defective in manufacturing test. In the preferred embodiment of the present invention the redundant columns are grouped within the blocks they support to help avoid the problem of erase variation in threshold voltage $V_T$.

Erase $V_T$ variation can occur when two or more blocks of unequal size are erased simultaneously. Because the blocks are of unequal size, the source switch for each is supporting an unequal load. And because the erasure is occuring simultaneously both blocks must finish erasing (without any of the cells going into the depletion mode) at approximately the same time. Supporting an unequal load for essentially the same length of time requires carefully matching the relative size (as determined by the relative size of the blocks being erased) of the pull-up transistors used to drive the common node of the source regions of the cells within each block. While this match is relatively easy when the blocks are close in size (or at least a slight mismatch is proportionally less critical) it can be difficult and expensive when the block sizes are not as close in size. When this match is not achieved, some of the cells in one of the blocks will go likely go into depletion mode which thus causes their erase $V_T$ to vary.

When providing redundant columns which are physically separate from the blocks they are supporting, the relative size of the redundant column block and the supported block would likely be great due to only needing a few redundant columns to support the few defective supported columns. In other words, in the interest of minimizing die size when adding redundant columns to maximize device yield, there is a point early reached where the advantages of increased yield are no longer offset by the disadvantages of increased die size. As such, only a few columns would be added to support column redundancy. And placing these relatively few columns in a separate block could easily result in an erase VT variation between the redundant columns and the columns of the supported block.

In the preferred embodiment, although each of the eight main blocks normally comprise only 112 columns, each main block includes an additional 4 redundant columns whose output is supported by the additional selector in selectors 90–97. Not only does this embodiment provide for column redundancy with its associated increased device yield but it also helps avoid the erase VT variation problem because the redundant columns are driven by the same pull-up transistor as the rest of the columns in each block.

Note that the preferred embodiment provides for up to 4 redundant columns per byte of the main block area. And also note that no redundancy is provided for either the boot or parameter blocks. This is because the main block is 87.5% (896÷1024) of the entire memory array and thus there is less likelihood of finding a defective bit line in the boot or parameter blocks. This is further supported by financial analysis which compared the increased device cost to support column redundancy for the boot and/or parameter blocks versus the small potential of an increased device yield.

In the foregoing specification, the invention has been described with reference to the presently preferred embodiment thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A memory device having a plurality of electrically programmable and electrically erasable memory cells each having a source region, drain region and control gate, the memory device comprising:

two memory arrays, each array divided into multiple blocks wherein each block has a plurality of generally parallel bit lines coupled to the drain regions of the memory cells within the block such that each of the two memory arrays comprise five blocks wherein four of the five blocks comprise 112 bit lines each and a remaining one of the five blocks comprises 64 bit lines, each of the two memory arrays being arranged such that each of the four 112 bit line blocks are contiguous and each 64 bit line block is located between four contiguous 112 bit line blocks;

word lines, generally perpendicular to the bit lines, coupled to the control gates of one cell in each bit line;

row decoder means located between the two arrays and between the 64 bit line blocks of each of the two arrays, the row decoder means decoding row addresses and selecting word lines such that when one of the word lines is selected the potential on the control gates along the word line in all of the blocks is changed:

column decoder means for decoding column addresses and for selecting bit lines such that when any of the bit lines are selected the potential on the drain regions connected to the bit lines is changed, the column decoder including:

one 1:16 decoder for outputting a first decoder signal in response to a column address where the 1:16 decoder is located between the first array and the second array;

seven 1:16 selectors coupled to the first 112 bit line block of the first array for outputting 7 selected bit line signals in response to the first decoder signal;

seven 1:16 selectors coupled to the second 112 bit line block of the first array for outputting 7 selected bit line signals in response to the first decoder signal;

seven 1:16 selectors coupled to the third 112 bit line block of the first array for outputting 7 selected bit line signals in response to the first decoder signal;

seven 1:16 selectors coupled to the fourth 112 bit line block of the first array for outputting 7 selected bit line signals in response to the first decoder signal;

eight 1:8 selectors coupled to the 64 bit line block of the first array for outputting 8 selected bit line signals in response to the first decoder signal;

eight 1:8 selectors coupled to the 64 bit line block of the second array for outputting 8 selected bit line signals in response to the first decoder signal;

seven 1:16 selectors coupled to the first 112 bit line block of the second array for outputting 7 selected bit line signals in response to the first decoder signal;

seven 1:16 selectors coupled to the second 112 bit line block of the second array for outputting 7 selected bit line signals in response the first decoder signal;

seven 1:16 selectors coupled to the third 112 bit line block of the second array for outputting 7 selected bit line signals in response to the first decoder signal;

seven 1:16 selectors coupled to the fourth 112 bit line block of the second array for outputting 7 selected bit line signals in response the first decoder signal;

one 1:8 decoder for outputting a second decoder signal in response to a column address wherein the 1:8 decoder is located between the first array and the second array;

one 1:8 selector coupled to receive the 7 selected bit line signals from the seven 1:16 selectors from the first 112 bit line block of the first array, and to receive a selected bit line signal from the first of the eight 1:8 selectors from the 64 bit line block of the first array and the first of the eight 1:8 selectors from the 64 bit block of the second array, for outputting 1 selected signal in response to the second decoder signal;

one 1:8 selector coupled to receive the 7 selected bit line signals from the seven 1:16 selectors from the second 112 bit line block of the first array, and to receive a selected bit line signal from the second of the eight 1:8 selects from the 64 bit line block of the first array and the second of the eight 1:8 selectors from the 64 bit line block of the second array, for outputting 1 selected signal in response to the second decoder signal;

one 1:8 selector coupled to receive the 7 selected bit line signals from the seven 1:16 selectors from the third 112 bit block of the first array, ad to receive a selected bit line signal from the third of the eight 1:8 selectors from the 64 bit line block of the first aray and the third of the eight 1:8 selectors from the 64 bit line block of the second array, for outputting 1 selected signal in response to the second decoder signal;

one 1:8 selector coupled to receive the 7 selected bit line signals from the seven 1:16 selectors from the fourth 112 bit line block of the first array, and to receive a selected bit line signal from the fourth of the eight 1:8 selectors from the 64 bit line block of the first array and the fourth of the eight 1:8 selectors from the 64 bit block of the second array, for outputting 1 selected signal in response to the second decoder signal.

one 1:8 selector coupled to receive the 7 selected bit line signals from the seven 1:16 selectors from the first 112 bit line block of the second array, and to receive a selected bit line signal from the fifth of the eight 1:8 selectors from the 64 bit line block of the first array and the fifth of the eight 1:8 selectors from the 64 bit line block of the second array, for outputting 1 selected signal in response to the second decoder signal;

one 1:8 selector coupled to receive the 7 selected bit line signals from the seven 1:16 selectors from the seond 112 bit line block of the second array, and to receive a selected bit line signal from the sixth of the eight 1:8 selectors from the 64 bit line block of the first array and the sixth of the eight 1:8 selectors from the 64 bit line block of the second array, for outputting 1 selected signal in response to the second decoder signal;

one 1:8 selector coupled to receive the 7 selected bit lie signals from the seven 1:16 selectors from the third 112 bit line block of the second array, and to receive a selected bit line signal from the seventh of the eight 1:8 selectors from the 64 bit line block of the first array and the seven of the eight 1:8 selectors from the 64 bit line block of the second array, for outputting 1 selected signal in response the second decoder signal;

one 1:8 selector coupled to receive the 7 selected bit line signals from the seven 1:16 selectors from the fourth 112 bit line block of the second array, and to receive a selected bit line signal from the eighth of the eight 1:8 selectors from the 64 bit line block of the first array and the eighth 1:8 selectors from the 64 bit line block of the second array, for outputting 1 selected signal in response the second decoder signal; and source switching means for connecting the source regions of the cells in each block such that the potential on the source in a selected block is changed.

2. The memory device of claim 1 wherein each of the four 112 bit line blocks of the first array and each of the four 112 bit line blocks of the second array further include 4 redundant bit lines.

3. The memory device of claim 1 wherein each of the four 112 bit line blocks of the first array and each of the four 112 bit line blocks of the second array together comprise 112 KB of memory space, the 64 bit line block of the first array comprises 8 KB of memory space, and the 64 bit line block of the second array comprises 8 KB of memory space.

4. The memory device of claim 1 wherein each of the four 112 bit line blocks of the first array and each of the four 112 bit line blocks of the second array are main application spaces, the 64 bit line block of the first array is a boot space, and the 64 bit line block of the second array is a parameter space.

5. The memory device of claim 1 wherein each of the four 112 bit line blocks of the first array and each of the four 112 bit line blocks of the second array are main application spaces, the 64 bit line block of the first array is a parameter space, and the 64 bit line block of the second array is a boot space.

6. The memory device of claim 1 wherein the column address signals to the 1:16 decoder and the column address signals to the 1:8 decoder are selectively inverted to switch the logical order of the blocks within the address space of the memory device.

7. The memory device of claim 1 wherein the 64 bit line block of the second array is further divided into two contiguous 32 bit line blocks.

8. A memory device having a plurality of electrically programmable and electrically erasable memory cells each having a source region, drain region, floating gate and control gate, the memory device comprising:

two memory arrays for storing and segregating three types of data including boot data, parameter data, and main application data, each array divided into multiple blocks wherein each block has a plurality of generally parallel bit lines coupled to the drain regions of the memory cells within the block such that:

the first array comprises five blocks wherein four of the five blocks comprise 112 bit lines each and the remaining one of the five blocks comprises 64 bit lines, the four 112 bit line blocks of the first array storing main application data, and the 64 bit line block of the first array storing parameter data;

the second array comprises five blocks wherein a one of the five blocks comprises 64 bit lines and the remaining four of the five blocks comprise 112 bit lines each, the four 112 bit line blocks of the second array storing main application data, the 64 bit line block of the second array storing boot data;

word lines, generally perpendicular to the bit lines, coupled to the control gates of one cell line each bit line;

row decoder means located between the two memory arrays and between the 64 bit line blocks of the two arrays, the row decoding means decoding row addresses and for selecting word lines such that when one of the word line is selected the potential on the control gates along the word line in all of the blocks is changed;

column decoder means for decoding column addresses and for selecting bit lines such that when any of the bit lines are selected the potential on the drain regions connected to the bit lines is changed;

source switching means for connecting the source regions of the cells in each block such that the potential on the source regions in a selected block is changed.

9. The memory device of claim 8 wherein the five blocks of the first array are arranged such that each of the four 112 bit line blocks are contiguous.

10. The memory device of claim 9 wherein the five blocks of the second array are arranged such that each of the four 112 bit line blocks are contiguous.

11. The memory device of claim 10 wherein the column decoder means is comprised of:

one 1:16 decoder for outputting a first decoder signal in response to a column address wherein the 1:16 decoder is located between the first array and the second array;

seven 1:16 selectors coupled to the first 112 bit line block of the first array for outputting 7 selected bit line signals in response to the first decoder signal;

seven 1:16 selectors coupled to the second 112 bit line block of the first array for outputting 7 selected bit line signals in response to the first decoder signal;

seven 1:16 selectors coupled to the third 112 bit line block of the first array for outputting 7 selected bit line signals in response to the first decoder signal;

seven 1:16 selectors coupled to the fourth 112 bit line block of the first array for outputting 7 selected bit line signals in response to the first decoder signal;

eight 1:8 selectors coupled to the first 64 bit line block of the first array for outputting 8 selected bit line signals in response to the first decoder signal;

eight 1:4 selectors coupled to the first 32 bit line block of the second array for outputting 8 selected bit line signals in response to the first decoder signal;

eight 1:4 selectors coupled to the second 32 bit line block of the second array for outputting 8 selected bit line signals in response to the first decoder signal;

seven 1:16 selectors coupled to the first 112 bit line block of the second array for outputting 7 selected bit line signals in response to the first decoder signal;

seven 1:16 selectors coupled to the second 112 bit line block of the second array for outputting 7 selected bit line signals in response to the first decoder signal;

seven 1:16 selectors coupled to the third 112 bit line block of the second array for outputting 7 selected bit line signals in response to the first decoder signal;

seven 1:16 selectors coupled to the fourth 112 bit line block of the second array for outputting 7 selected bit line signals in response to the first decoder signal;

one 1:8 decoder for outputting a second decoder signal in response to a column address wherein the 1:8 decoder is located between the first array and the second array;

one 1:8 selector coupled to receive the 7 selected bit line signals from the seven 1:16 selectors from the first 112 bit line block of the first array, and to receive a selected bit line signal from the first of the eight 1:8 selectors from the first 64 bit line block of the first array, the first of the eight 1:4 selectors from the first 32 bit line block of the second array, and the first of the eight 1:4 selectors from the second 32 bit line block of the second array, for outputting 1 selected signal in response to the second decoder signal;

one 1:8 selector coupled to receive the 7 selected bit line signals from the seven 1:16 selectors from the second 112 bit line block of the first array, and to receive a selected bit line signal from the second of the eight 1:8 selectors from the first 64 bit line block of the first array, the second of the eight 1:4 selectors from the first 32 bit line block of the second array, and the second of the eight 1:4 selectors from the second 32 bit line block of the second array, for outputting 1 selected signal in response to the second decoder signal;

one 1:8 selector coupled to receive the 7 selected bit line signals from the seven 1:16 selectors from the third 112 bit line block of the first array, and to receive a selected bit line signal from the third of the eight 1:8 selectors from the first 64 bit line block of the first array, the third of the eight 1:4 selectors from the first 32 bit line block of the second array, and the third of the eight 1:4 selectors from the second 32 bit line block of the second array, for outputting 1 selected signal in response to the second decoder signal;

one 1:8 selector coupled to receive the 7 selected bit line signals from the seven 1:16 selectors from the fourth 112 bit line block of the first array, and to receive a selected bit line signal from the fourth of the eight 1:8 selectors from the first 64 bit line block of the first array, the fourth of the eight 1:4 selectors from the first 32 bit line block of the second array, and the fourth of the eight 1:4 selectors from the second 32 bit line block of the second array, for outputting 1 selected signal in response to the second decoder signal;

one 1:8 selector coupled to receive the 7 selected bit line signals from the seven 1:16 selectors from the first 112 bit line block of the second array, and to receive a selected bit line signal from the fifth of the eight 1:8 selectors from the first 64 bit line block of the first array, the fifth of the eight 1:4 selectors from the first 32 bit line block of the second array, and the fifth of the eight 1:4 selectors from the second 32 bit line block of the second array, for outputting 1 selected signal in response to the second decoder signal;

one 1:8 selector coupled to receive the 7 selected bit line signals from the seven 1:16 selectors from the second 112 bit line block of the second array, and to receive a selected bit line signal from the sixth of the eight 1:8 selectors from the first 64 bit line block of the first array, the sixth of the eight 1:4 selectors from the first 32 bit line block of the second array, and the sixth of the eight 1:4 selectors from the second 32 bit line block of the second array, for outputting 1 selected signal in response to the second decoder signal;

one 1:8 selector coupled to receive the 7 selected bit line signals from the seven 1:16 selectors from the third 112 bit line block of the second array, and to receive a selected bit line signal from the seventh of the eight 1:8 selectors from the first 64 bit line block of the first array, the seventh of the eight 1:4 selectors from the first 32 bit line block of the second array, and the seventh of the eight 1:4 selectors from the second 32 bit line block of the second array, for outputting 1 selected signal in response to the second decoder signal;

one 1:8 selector coupled to receive the 7 selected bit line signals from the seven 1:16 selectors from the fourth 112 bit line block of the second array, and to receive a selected bit line signal from the eighth of the eight 1:8 selectors from the first 64 bit line block of the first array, the eighth of the eight 1:4 selectors from the first 32 bit line block of the second array, and the eighth of eight 1:4 selectors from the second 32 bit line block of the second array, for outputting 1 selected signal in response to the second decoder signal.

12. The memory device of claim 8 wherein each of the four 112 bit line blocks of the first array and each of the four 112 bit line blocks of the second array further include 4 redundant bit lines.

13. The memory device of claim 11 wherein each of the four 112 bit line blocks of the first array and each of the four 112 bit line blocks of the second array together comprise 112 KB of memory space, the 64 bit line block of the first array comprises 8 KB of memory space, the first 32 bit line block of the second array comprises 4 KB of memory space, and the second 32 bit line block of the second array comprises 4 KB of memory space.

14. The memory device of claim 11 wherein the column address signals to the 1:16 decoder and the column address signals to the 1:8 decoder are selectively inverted to switch the logical order of the blocks within the address space of the memory device.

15. The memory device of claim 8 wherein the 64 bit line block of the second array is further divided into two contiguous 32 bit line blocks.

* * * * *